(12) United States Patent
Miyazaki et al.

(10) Patent No.: US 8,043,978 B2
(45) Date of Patent: Oct. 25, 2011

(54) ELECTRONIC DEVICE AND METHOD FOR PRODUCING ELECTRONIC DEVICE

(75) Inventors: Hisao Miyazaki, Wako (JP); Kazuhito Tsukagoshi, Wako (JP); Syunsuke Odaka, Wako (JP); Yoshinobu Aoyagi, Wako (JP)

(73) Assignee: Riken, Saitama (JP)

( * ) Notice: Subject to any disclaimer, the term of this patent is extended or adjusted under 35 U.S.C. 154(b) by 553 days.

(21) Appl. No.: 12/194,106

(22) Filed: Aug. 19, 2008

(65) Prior Publication Data

US 2009/0139752 A1 Jun. 4, 2009

(30) Foreign Application Priority Data

Oct. 11, 2007 (JP) ................................. 2007-265556

(51) Int. Cl.
*H01L 21/316* (2006.01)
*H01L 21/473* (2006.01)
(52) U.S. Cl. ........ 438/768; 438/287; 438/591; 438/688; 148/285
(58) Field of Classification Search .................. 977/734, 977/742, 750, 752, 755, 758, 762, 938; 438/688, 438/770, 773, FOR. 494; 437/983; 148/276, 148/277, 285
See application file for complete search history.

(56) References Cited

U.S. PATENT DOCUMENTS

| | | | | |
|---|---|---|---|---|
| 5,155,566 A * | 10/1992 | Nakayama et al. | ............. | 257/40 |
| 6,579,767 B2 * | 6/2003 | Park et al. | ..................... | 438/287 |
| 6,972,467 B2 * | 12/2005 | Zhang et al. | .................. | 257/401 |
| 7,015,500 B2 * | 3/2006 | Choi et al. | ....................... | 257/40 |
| 7,115,916 B2 * | 10/2006 | Avouris et al. | ................. | 257/103 |
| 7,180,107 B2 * | 2/2007 | Appenzeller et al. | ......... | 257/288 |
| 7,368,791 B2 * | 5/2008 | Zhang et al. | ................... | 257/401 |
| 7,399,703 B2 * | 7/2008 | Kawakami | .................... | 438/669 |
| 7,402,506 B2 * | 7/2008 | Levy et al. | ..................... | 438/584 |
| 7,425,487 B2 * | 9/2008 | Kreupl et al. | ................. | 438/284 |
| 7,439,562 B2 * | 10/2008 | Auvray et al. | ................. | 257/253 |
| 7,714,386 B2 * | 5/2010 | Pesetski et al. | ............... | 257/347 |

(Continued)

FOREIGN PATENT DOCUMENTS

WO  WO-98/02449  1/1998

OTHER PUBLICATIONS

Chen et al., The Role of Metal-Nanotube Contact in the Performance of Carbon Nanotube Field-Effect Transistors, Nano Letters, vol. 5, No. 7, 2005, pp. 1497-1502.*

(Continued)

*Primary Examiner* — David Vu
*Assistant Examiner* — Earl Taylor
(74) *Attorney, Agent, or Firm* — Birch, Stewart, Kolasch & Birch, LLP

(57) ABSTRACT

Provided is a novel electronic device that comprises graphite, graphene or the like.
An electronic device having a substrate, a layer comprising a 6-member ring-structured carbon homologue as the main ingredient, a pair of electrodes, a layer comprising aluminium oxide as the main ingredient and disposed between the pair of electrodes, and a layer comprising aluminium as the main ingredient, wherein the layer comprising aluminium oxide as the main ingredient is disposed between the layer comprising a 6-member ring-structured carbon homologue as the main ingredient and the layer comprising aluminium as the main ingredient so as to be in contact with the two layers.

2 Claims, 2 Drawing Sheets

U.S. PATENT DOCUMENTS

| | | | | |
|---|---|---|---|---|
| 7,787,292 | B2* | 8/2010 | Keshavarzi et al. | 365/174 |
| 7,846,819 | B2* | 12/2010 | Pribat et al. | 438/479 |
| 7,875,878 | B2* | 1/2011 | Wu et al. | 257/40 |
| 2004/0036128 | A1* | 2/2004 | Zhang et al. | 257/401 |
| 2004/0061422 | A1* | 4/2004 | Avouris et al. | 313/315 |
| 2005/0079659 | A1* | 4/2005 | Duan et al. | 438/197 |
| 2005/0121728 | A1* | 6/2005 | Bao | 257/369 |
| 2005/0224888 | A1* | 10/2005 | Graham et al. | 257/368 |
| 2005/0266605 | A1* | 12/2005 | Kawakami | 438/99 |
| 2006/0011972 | A1* | 1/2006 | Graham et al. | 257/324 |
| 2006/0118777 | A1* | 6/2006 | Hirakata et al. | 257/39 |
| 2006/0261419 | A1* | 11/2006 | Kreupl et al. | 257/401 |
| 2006/0286737 | A1* | 12/2006 | Levy et al. | 438/199 |
| 2007/0001219 | A1* | 1/2007 | Radosavljevic et al. | 257/327 |
| 2007/0001220 | A1* | 1/2007 | Tombler et al. | 257/330 |
| 2007/0056063 | A1* | 3/2007 | Auvray et al. | 977/847 |
| 2007/0155065 | A1* | 7/2007 | Borkar et al. | 438/149 |
| 2007/0187694 | A1* | 8/2007 | Pfeiffer | 257/76 |
| 2007/0281409 | A1* | 12/2007 | Zhang et al. | 438/197 |
| 2007/0286953 | A1* | 12/2007 | MacPherson et al. | 427/240 |
| 2008/0035494 | A1* | 2/2008 | Gomez et al. | 205/792 |
| 2008/0105949 | A1* | 5/2008 | Zhang et al. | 257/584 |
| 2008/0108214 | A1* | 5/2008 | Majumdar et al. | 438/597 |
| 2008/0128760 | A1* | 6/2008 | Jun et al. | 257/280 |
| 2008/0258207 | A1* | 10/2008 | Radosavljevic et al. | 257/327 |
| 2009/0003028 | A1* | 1/2009 | Keshavarzi et al. | 365/96 |
| 2009/0014757 | A1* | 1/2009 | Takulapalli et al. | 257/253 |
| 2009/0020764 | A1* | 1/2009 | Anderson et al. | 257/77 |
| 2009/0050876 | A1* | 2/2009 | Marks et al. | 257/24 |
| 2009/0087639 | A1* | 4/2009 | Li et al. | 428/304.4 |
| 2009/0139752 | A1* | 6/2009 | Miyazaki et al. | 174/256 |
| 2009/0140236 | A1* | 6/2009 | Wu et al. | 257/40 |
| 2009/0140237 | A1* | 6/2009 | Wu et al. | 257/40 |
| 2009/0224230 | A1* | 9/2009 | Pesetski et al. | 257/24 |
| 2010/0252812 | A1* | 10/2010 | Raychowdhury et al. | 257/24 |
| 2010/0261338 | A1* | 10/2010 | Tsakalakos et al. | 438/478 |

OTHER PUBLICATIONS

Liang et al., Graphene Transistors Fabricated via Transfer-Printing in Device Active-Areas on Large Wafer, Nano Letters, vol. 7, No. 12, 2007, pp. 3840-3844.*

Berger et al., Ultrathin Epitaxial Graphite: 2D Electron Gas Properties and a Route toward Graphene-based Nanoelectronics., J. Phys. Chem. B, 108, 2004, pp. 19912-19916.*

Sulpizio et al., Nanofabrication of top-gated carbon nanotube-based transistors: Probing electron-electron interactions in one-dimensional systems, J. Mater. Res., vol. 21, No. 11, 2006, pp. 2916-2921.*

Klinke et al., Field-Effect Transistors Assembled from Functionalized Carbon Nanotubes, Nano Letters, vol. 6, No. 5, 2006, pp. 906-910.*

Definition of "carbon nanotube" from Formula One Technical online glossary.*

Fu et al., Carbon Nanotubes Coated with Alumina as Gate Dielectrics of Field-Effect Transistors, Advanced Materials, 18, 2006, pp. 181-185.*

Das et al., Monitoring dopants by Raman scattering in an electrochemically top-gated graphene transistor, Nature Nanotechnology, vol. 3, Apr. 2008, pp. 210-215.*

Bullis, Carbon Nantube Computers, Technology Review online, May 2006.*

Avouris et al., Carbon Nanotube Electronics, Proceedings of the IEEE, vol. 91, No. 11, 2003, pp. 1772-1784.*

Lin et al., Strong Suppression of Electrical Noise in Bilayer Graphene Nanodevices, Nano Letters, vol. 8, No. 8, Feb. 2008, pp. 2119-2125.*

Fu et al., Generic Approach to Modulate Conductivity and Coat Discontinuous Gate Dielectrics of Carbon Nanotubes, J. Phys. Chem. C, 111, 2007, pp. 8098-8104.*

Huang et al., Ultrathin Aluminum Oxide Gate Dielectric on N-Type 4H-SiC Prepared by Low Thermal Budget Nitric Acid Oxidation, IEEE Transactions on Electron Devices, vol. 51, No. 11, 2004, pp. 1877-1882.*

H. Miyazaki, et al., "Electric field effect on electron transport of ultra-thin graphite film by Al top gate", Meeting Abstracts of the Physical Society of Japan, vol. 62, Issue 2, Part 4, pp. 673-1028 (2007), 24aRA-9 Abs.

H. Miyazaki, et al., "High efficient gate for ultra-thin graphite FET by an Al electrode," Extended Absracts (The 68th Autumn Meeting, 2007); The Japan Society of Applied Physics, No. 3, 4p-Q-2 Abs.

J. Sambrook, et al., Molecular Cloning: A Laboratory Manual, Second Edition, pp. 5.61-5.67 (1989).

* cited by examiner

ELECTRONIC DEVICE AND METHOD FOR PRODUCING ELECTRONIC DEVICE

TECHNICAL FIELD

The present invention relates to an electronic device and a method for producing an electronic device.

BACKGROUND ART

Studies of graphite and graphene as next-generation switching materials have begun all over the world. This is because graphite and graphene has the possibility to be far higher in the mobility than that of silicone and because these are carbon materials and therefore could be ecological materials.

For example, "Electric Field Effect in Atomically Thin Carbon Films", by K. S. Novoselov, A. K. Geim, S. V. Morozov, D. Jiang, Y. Zhang, S. V. Dubonos, I. V. Grigorieva, and A. A. Firsov in Science Vol. 306, p. 666, 2004; and "Fabrication and electric-field-dependent transport measurements of mesoscopic graphite devices", by Yuanbo Zhang, Joshua P. Small, William V. Pontius, and Philip Kim, in Applied Physics Letters, Vol. 86, 073104, 2005 report the carrier concentration inside a graphite thin film, using an $SiO_2$ thin film on an Si substrate as a gate insulating film. The devices described in these references have some problems in that, since the substrate serves as a gate electrode, the gate could not accept independent operation for individual devices and that, since the $SiO_2$ insulating film is thick, a large gate voltage (about 100 V) is needed.

"Transport Measurements Across a Tunable Potential Barrier in Graphene", by B. Huard, J. A. Sulpizio, N. Stander, K. Todd, B. Yang, and D. Goldhaber-Gordon, in Physical Review Letters, Vol. 98, 236803 (2007) reports formation of a polymethyl methacrylate (PMMA) resin film on a graphite thin film by coating thereon as a top gate insulating film for potential control inside the graphite thin film. However, this is troublesome in that PMMA must be applied and crosslinked through exposure to electronic beam, and in addition, since the insulating film is 40 nm and is not sufficiently thin, the gate voltage reducing effect is insufficient.

DISCLOSURE OF THE INVENTION

Problems that the Invention is to Solve

Based on these back ground arts, the present inventors have investigated the production of useful electronic devices with graphite or graphene. Regarding the gate structure of conventional electronic devices, known are a bottom-gate electronic device in which the gate position is below the channel, and a top-gate electronic device in which the gate position is above the channel, but both of these have many problems.

In the bottom-gate electronic device, a gate insulating film is formed on the gate electrode, and therefore, in general, an $SiO_2$ thin film is formed on an Si substrate. In this case, the thickness of the $SiO_2$ thin film is the thickness of the gate insulating film. In case where those electronic devices are formed on one and the same substrate, the gate electrode shall be common to the devices and therefore independent motion control of individual devices is impossible; and for these reasons, the development of the devices into practical use could not be expected. Even though the gate insulating film is thinned, the thickness of the insulating film must be at least tens nm for the purpose of preventing a leak current from the channel formed just above the gate insulting film and from the electrode terminal, and as a result, this brings about a problem in that the application efficiency of the gate electrode is lowered.

On the other hand, in the top-gate electronic device, an insulating film must be formed on the channel, and in many cases, an Si oxide film, an Si nitride film or their mixed film is used for the insulating film. However, the thin film generally requires treatment at a temperature not lower than 500° C. or plasma treatment in its formation, which, however, causes serious damage to the channel. For solving the problem, use of an organic material for the channel has been investigated, but, in general, the organic material has a problem in that, as compared with an organic material, the organic material is low in the dielectric constant and therefore the organic material lowers the gate impressed efficiency. Further, the organic material could hardly form an insulating film resistant to long-term use.

The present invention is to solve these problems, and its object is to provide a novel electronic device that comprises graphite, graphene or the like and is useful as a next-generation switching material.

Means for Solving the Problems

Given the situation as above, the present inventors have assiduously studied and, as a result, have found that a device constructed by forming an aluminium layer directly on graphite followed by oxidization can move at high voltage efficiency, and have completed the present invention.

Concretely, the invention includes the following:

(1) An electronic device having a substrate, a layer comprising a 6-member ring-structured carbon homologue as the main ingredient, a pair of electrodes, a layer comprising aluminium oxide as the main ingredient and disposed between the pair of electrodes, and a layer comprising aluminium as the main ingredient, wherein the layer comprising aluminium oxide as the main ingredient is disposed between the layer comprising a 6-member ring-structured carbon homologue as the main ingredient and the layer comprising aluminium as the main ingredient so as to be in contact with the two layers.

(2) The electronic device of (1), which has, on the substrate, the layer comprising a 6-member ring-structured carbon homologue as the main ingredient, the pair of electrodes, the layer comprising aluminium oxide as the main ingredient, and the layer comprising aluminium as the main ingredient in that order.

(3) The electronic device of (1) or (2), wherein the layer comprising aluminium oxide as the main ingredient is formed by providing the layer comprising a 6-member ring-structured carbon homologue as the main ingredient and the layer comprising aluminium as the main ingredient so as to be in contact with the layer followed by oxidization.

(4) The electronic device of (1) or (2), wherein the layer comprising aluminium oxide as the main ingredient is formed by providing the layer comprising a 6-member ring-structured carbon homologue as the main ingredient and the layer comprising aluminium as the main ingredient so as to be in contact with the layer followed by spontaneous oxidization.

(5) The electronic device of any of (1) to (4), wherein the thickness of the layer comprising aluminium oxide as the main ingredient is from 1 to 10 nm.

(6) The electronic device of any of (1) to (4), wherein the thickness of the layer comprising a 6-member ring-structured carbon homologue as the main ingredient is from 0.3 to 10 nm, the thickness of the layer comprising aluminium as the main ingredient is from 10 to 100 nm, and the thickness of the layer comprising aluminium oxide as the main ingredient is from 1 to 10 nm.

(7) The electronic device of any of (1) to (6), wherein the 6-member ring-structured carbon homologue is graphite, graphene or carbon nanotube.

(8) The electronic device of any of (1) to (6), wherein the 6-member ring-structured carbon homologue is graphite or graphene.

(9) A method for producing an electronic device, comprising providing a layer comprising a 6-member ring-structured carbon homologue as the main ingredient on a substrate, providing a layer comprising aluminium as the main ingredient so as to be in contact with the layer comprising aluminium as the main ingredient, providing a pair of electrodes, and providing a layer comprising aluminium oxide as the main ingredient between the layer comprising a 6-member ring-structure carbon homologue as the main ingredient and the layer comprising aluminium as the main ingredient, through oxidation.

(10) The method for producing an electronic device of (9), wherein the layer comprising a 6-member ring-structure carbon homologue as the main ingredient, the layer comprising aluminium as the main ingredient and the pair of electrodes are provided in that order on the support.

(11) The method for producing an electronic device of (9) or (10), wherein the electronic device is the electronic device of any of (1) to (8).

(12) The method for producing an electronic device of any of (9) to (11), wherein the oxidization is spontaneous oxidization.

BEST MODE FOR CARRYING OUT THE INVENTION

The contents of the invention are described in detail hereinunder. In this description, the numerical range expressed by the wording "a number to another number" means the range that falls between the former number indicating the lowermost limit of the range and the latter number indicating the uppermost limit thereof. The wording "comprising . . . as the main ingredient" in the layer comprising a 6-member ring-structured carbon homologue as the main ingredient, the layer comprising aluminium oxide as the main ingredient and the layer comprising aluminium as the main ingredient means that the content (ratio by weight) of the ingredient is the largest in the layer. In general, it means that the layer does not contain any others than impurities and additives for enhancing the performance of the electronic device.

The electronic device of the invention has a substrate, a layer comprising a 6-member ring-structured carbon homologue as the main ingredient (this may be hereinafter referred to as "6-member ring-structured carbon homologue layer"), a layer comprising aluminium oxide as the main ingredient (this may be hereinafter referred to as "aluminium oxide layer"), and a layer comprising aluminium as the main ingredient (this may be hereinafter referred to as "aluminium layer"), and is characterized in that the aluminium oxide layer is disposed between the 6-member ring-structured carbon homologue layer and the aluminium layer so as to be in contact with the two layers. Heretofore, no proposal has been made for the studies of structures efficient for voltage application. Employing the structure as above, the present invention has succeeded in providing an electronic device capable of working with an increased voltage efficiency higher by at least 100 times than that of an ordinary electronic device that comprises an $SiO_2$ film having a thickness of 300 nm as an insulating film. This is the highest efficiency in the world. The ordinary case of using the conventional inorganic insulating film has a problem in that the device being produced is damaged by the high-temperature process in the production process; and the invention has solved the problem. Further, as compared with a case of using a conventional organic insulating film, the invention has an advantage in that the device is deteriorated little with time.

Figure 1:
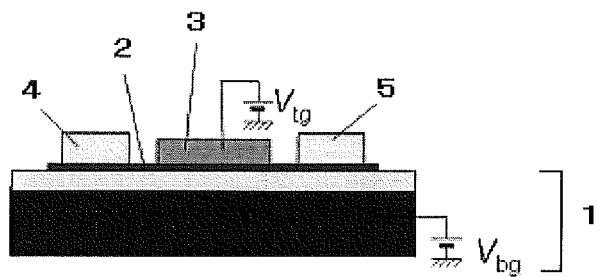
FIG. 1 is an outline view showing one example of the electronic device of the invention.

The electronic device of the invention is described in detail hereinunder. FIG. 1 shows one example of a preferred embodiment of the invention.

In FIG. 1, 1 is a substrate, and its material may be any one widely used in the field of field effect transistors, etc. Its examples include substrates prepared by forming an $SiO_2$ film on an Si-doped substrate, and plastic substrates. Needless-to-say, any others than those substrates are employable herein.

In FIG. 1, 2 is a 6-member ring-structured carbon homologue layer, and 3 is an aluminium layer. In the invention, an aluminium oxide layer (not shown) is provided between the 6-member ring-structured carbon homologue layer 2 and the aluminium layer 3 so as to be in contact with the two layers. In this embodiment, the aluminium oxide layer serves as an insulating film in the electronic device, the 6-member ring-structured carbon homologue layer as a channel, and the aluminium layer as a gate electrode. Having the structure, the device can take advantage of the high mobility of the 6-member ring-structured carbon homologue such as graphite. Another advantage of this embodiment of the invention is that plural electronic devices of the embodiment can be individually driven by the respective voltage operation applied thereto. Further, because of the reasons to be mentioned below, in the electronic device of this embodiment, the aluminium oxide layer may be thin and the layer has a high dielectric constant, and therefore the device can be driven at a low gate voltage. In addition, the top gate and the back gate of the device make potential control from both the top side and the bottom side possible, and therefore there is a possibility that the device can control in-plane expanding electronic waves. In addition, since the gate insulating film is thin, the structure of the device makes short-distance potential modulation possible, therefore having another advantage of micropatternability in fabricating the device.

Preferably, the 6-member ring-structured carbon homologue layer in the invention has a thickness of from 0.3 nm to 10 nm. Preferably, the aluminium layer has a thickness of at least 10 nm, more preferably from 10 to 100 nm. The thickness of the aluminium oxide layer is preferably from 1 to 10 nm.

Figure 4:
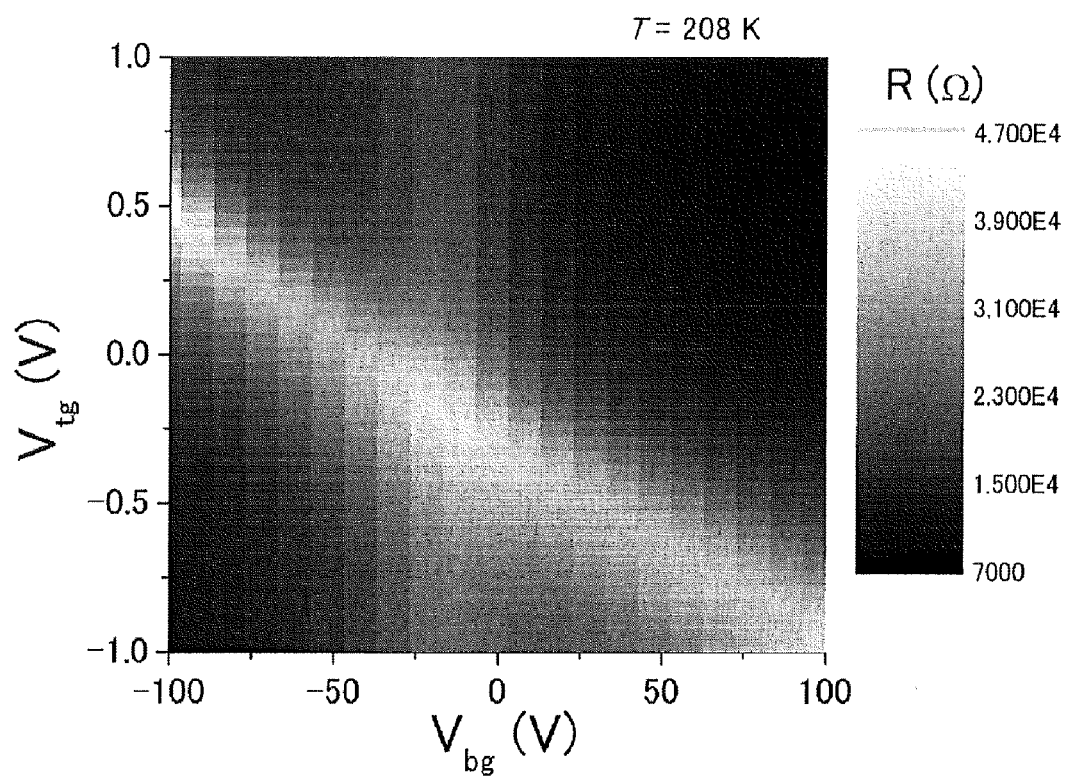
FIG. 4 shows the resistance change in the top gate having varied owing to voltage application to the back gate in the electronic device produced in the Example of the invention.

In FIGS. 1, 4 and 5 are a source electrode and a drain electrode, respectively. The materials of the source electrode and the drain electrode are not specifically defined, and ordinary electrodes widely used in the field of field effect transistors are employable herein. For example, there are mentioned titanium, gold, chromium, platinum, copper, etc.

This embodiment is a top gate-type device, but the invention is applicable also to back gate-type devices.

Not deviating from the gist and the scope of the invention, the electronic device of the invention may have any other constitutive layers.

The thickness of the electronic device of the invention may be generally from 30 to 100 nm excluding the substrate, but may be generally from 0.1 to 1 mm including the substrate.

The electronic device of the invention may be produced, for example, according to the following method.

First, a 6-member ring-structured carbon homologue layer is formed on a substrate. The method of forming it is not specifically defined. For example, a thin film of graphene or the like is, after cleaved with an adhesive tape, transferred onto a substrate to form the layer. The method enables formation of a flat and clean crystal face on the surface of the layer, and thin graphite could be readily adhered to the substrate.

Next, a pair of electrodes are formed. For forming the electrodes, also employable is any known method. For example, they may be formed according to electron ray lithography or vacuum vapor deposition.

Next, an aluminium layer is formed on the 6-member ring-structured carbon homologue layer so as to be in contact with it. The method of forming the aluminium layer is not also specifically defined. For example, it may be formed according to electron ray lithography or vacuum vapor deposition.

After the aluminium layer is formed, the substrate is oxidized to thereby form an aluminium oxide layer between the 6-member ring-structured carbon homologue layer and the aluminium layer. The oxidation is preferably spontaneous oxidation to be attained by leaving the substrate in air. The aluminium oxide layer is formed spontaneously by contact of the 6-member ring-structured carbon homologue layer and the aluminium layer, and has advantage that it has good self-repairability.

In the invention, the aluminium oxide layer is formed by such a simple method, but the insulation between the 6-member ring-structured carbon homologue layer and the aluminium layer is sufficient. Further, applying a gate voltage to the aluminium layer enables gate modulation of the conductivity of the 6-member ring-structured carbon homologue layer.

The above description is for production of a top gate-type electronic device; but a bottom gate-type electronic device can also be produced with reference to the above-mentioned method.

The electronic device of the invention can be widely used in high-mobility field-effect transistors, etc.

Examples

The invention is described in more detail with reference to the following Examples, in which the material used, its amount and the ratio, the details of the treatment and the treatment process may be suitably modified or changed not deviating the gist and the scope of the invention. Accordingly, the invention should not be limitatively interpreted by the Examples mentioned below.

An electronic device having the constitution of FIG. 1 was produced. Concretely, it was produced according to the following process.

Figure 2:
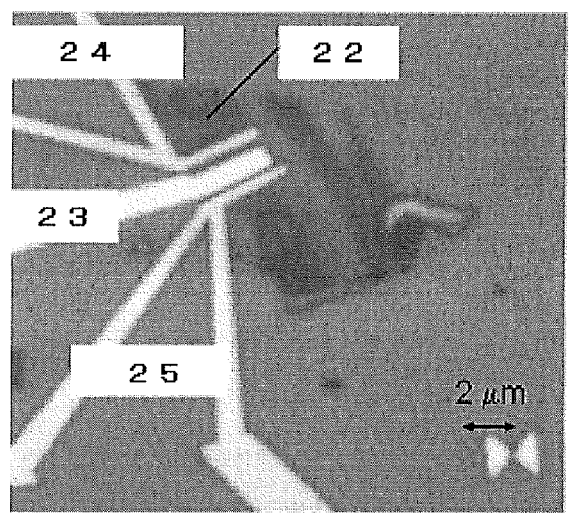
FIG. 2 shows the result of optical microscopic observation of the electronic device produced in the Example of the invention.

Highly-oriented pyrolytic graphite (HOPG) (NT-MDT's GRBS) was cleaved on an adhesive tape, and pressed to a Si substrate with 300 nm-thick oxidized layer on the surface (Ferrotec Silicone's 12488-131A), whereby the kish graphite was adhered to the substrate. Using an optical microscope observation, an electron beam resist was applied thereto, and this was processed through electron beam lithography and metal vapor deposition (titanium, 50 nm thick), and a source electrode and a drain electrode were thus deposited to it by lifting off. Next, in the same manner, an aluminium (30 nm thick) electrode was deposited to it, and the gate electrode is obtained (thickness of the device, 50 nm). The optical microscope image of the device is shown in FIG. 2. In FIG. 2, 22 is a graphite film, 23 is a top gate (aluminium), 24 is a source electrode (titanium), and 25 is a drain electrode (titanium).

Next, the device was exposed to air for about 5 hours, whereby an oxide film was spontaneously formed between the aluminium electrode and the graphite.

Figure 3:
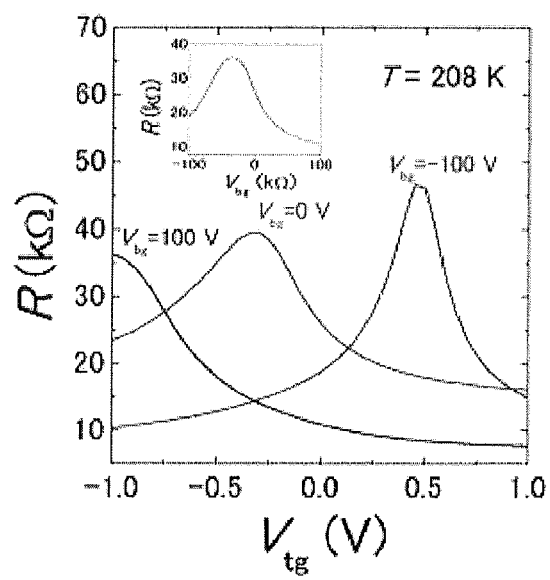
FIG. 3 shows the resistance change depending on the voltage of the gate electrode of the electronic device produced in the Example of the invention.

FIG. 3 shows the profile of the resistance R (kΩ) by the gate voltage in the device obtained in the above, at a temperature, T=208 (K). The resistance R of the electronic device obtained in this Example showed an ambipolar-type resistance profile having a peak structure relative to the top gate voltage $V_{tg}$ (V). Specifically, on the side on which the gate voltage is lower than the resistance peak, holes are major carriers; and on the side on which the voltage is higher, electrons are major carriers. The resistance change by the top gate voltage of 1 V is nearly on the same level as the resistance change by the back gate voltage ($V_{bg}$) of 100 V, as obvious from the comparison between the inserted graphs in FIG. 3. Thus, it is confirmed that the electronic device obtained in this example works at a low top gate voltage of about 1/100 of that of the back gate. Furthermore, voltage application to the back gate resulted in the shifting of the resistance curve as a function of the top gate voltage. The change to the back gate is analyzed in detail. As shown in FIG. 4, the resistance peak position to the top gate varies at a predetermined ratio relative to the back gate voltage. This means that the carrier concentration on the top surface of the thin film controlled by the top gate is controlled also by the back gate. From this, it is presumed that the graphite would be thinner than or on the same level as the electric field length.

INDUSTRIAL APPLICABILITY

By the invention, it has become possible to provide an electronic device that works with extremely high voltage-efficiency than conventional electronic devices. The electronic device of the invention can be produced by an very simple process as compared with conventional techniques, and therefore its production method is effective. In addition, the damage to graphene and graphite in the device can be reduced. In the invention, aluminium is used, and therefore the material cost is reduced and the invention is favorable for industrialization. Further, regarding the gate voltage driving, the efficiency in voltage application to the device of the invention is enhanced.

What is claimed is:

1. A method for producing an electronic device, comprising forming a layer comprising graphite or graphene as the main ingredient on a substrate, forming a layer comprising aluminium as the main ingredient so as to be in contact with the layer comprising graphite or graphene as the main ingredient, forming a pair of electrodes contacting the layer comprising graphite or graphene as the main ingredient, and forming a layer comprising aluminium oxide as the main ingredient between the layer comprising graphite or graphene as the main ingredient and the layer comprising aluminium as the main ingredient by oxidation of the layer comprising aluminium as the main ingredient by contacting aluminium in the layer comprising aluminium as the main ingredient with the layer comprising graphite or graphene as the main ingredient in air.

2. A method for producing an electronic device, comprising forming a layer comprising graphite or graphene as the main ingredient on a substrate, forming a pair of electrodes contacting the layer comprising graphite or graphene as the main ingredient, forming a layer comprising aluminium as the main ingredient so as to be in contact with the layer comprising graphite or graphene as the main ingredient, and forming a layer comprising aluminium oxide as the main ingredient between the layer comprising graphite or graphene as the main ingredient and the layer comprising aluminium as the main ingredient by oxidation of the layer comprising aluminium as the main ingredient by contacting aluminium in the layer comprising aluminium as the main ingredient with the layer comprising graphite or graphene as the main ingredient in air.

* * * * *